(12) United States Patent
Sakai et al.

(10) Patent No.: US 10,629,750 B2
(45) Date of Patent: Apr. 21, 2020

(54) DISPLAY DEVICE AND MANUFACTURING METHOD THEREOF

(71) Applicant: Japan Display Inc., Minato-ku (JP)

(72) Inventors: Takeshi Sakai, Minato-ku (JP); Yuichiro Hanyu, Minato-ku (JP); Masahiro Watabe, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/937,331

(22) Filed: Mar. 27, 2018

(65) Prior Publication Data

US 2018/0308987 A1 Oct. 25, 2018

(30) Foreign Application Priority Data

Apr. 25, 2017 (JP) ................ 2017-086081

(51) Int. Cl.
| | |
|---|---|
| *H01L 29/786* | (2006.01) |
| *H01L 27/12* | (2006.01) |
| *H01L 21/02* | (2006.01) |
| *H01L 21/383* | (2006.01) |
| *H01L 21/385* | (2006.01) |
| *H01L 21/428* | (2006.01) |
| *H01L 29/423* | (2006.01) |
| *G02F 1/1343* | (2006.01) |

(Continued)

(52) U.S. Cl.
CPC .. *H01L 29/78696* (2013.01); *H01L 21/02164* (2013.01); *H01L 21/383* (2013.01); *H01L 21/385* (2013.01); *H01L 21/428* (2013.01); *H01L 27/124* (2013.01); *H01L 27/127* (2013.01); *H01L 27/1225* (2013.01); *H01L 27/1262* (2013.01); *H01L 29/42384* (2013.01); *H01L 29/7869* (2013.01); *G02F 1/1368* (2013.01); *G02F 1/134363* (2013.01); *G02F 2001/13685* (2013.01); *H01L 27/3262* (2013.01)

(58) Field of Classification Search
CPC ......... H01L 29/78696; H01L 29/42384; H01L 27/127; H01L 27/1225; H01L 21/02164; H01L 29/7869; H01L 27/1262; H01L 27/124; H01L 21/428; H01L 21/385; H01L 21/383; H01L 27/3262; G02F 2001/13685; G02F 1/134363; G02F 1/1368

See application file for complete search history.

(56) References Cited

U.S. PATENT DOCUMENTS

| | | | |
|---|---|---|---|
| 9,318,654 B2* | 4/2016 | Arasawa | H01L 27/1225 |
| 9,741,752 B1* | 8/2017 | Hu | H01L 27/1225 |
| 9,882,062 B2* | 1/2018 | Yamazaki | H01L 29/7869 |

(Continued)

FOREIGN PATENT DOCUMENTS

JP 2008-294136 12/2008

*Primary Examiner* — David Vu
(74) *Attorney, Agent, or Firm* — Oblon, McClelland, Maier & Neustadt, L.L.P.

(57) ABSTRACT

The purpose of the invention is to form the TFT of the oxide semiconductor, in which influence of variation in mask alignment is suppressed, thus, manufacturing a display device having a TFT of stable characteristics. The concrete measure is as follows. A display device including plural pixels, each of the plural pixels having a thin film transistor (TFT) of an oxide semiconductor comprising: a width of the oxide semiconductor in the channel width direction is wider than a width of the gate electrode in the channel width direction.

15 Claims, 16 Drawing Sheets

(51) Int. Cl.
  *H01L 27/32* (2006.01)
  *G02F 1/1368* (2006.01)

(56) References Cited

U.S. PATENT DOCUMENTS

2008/0291350 A1    11/2008  Hayashi et al.
2013/0009209 A1*   1/2013   Yamazaki ........... H01L 27/1225
                                                  257/192
2018/0358469 A1*   12/2018  Uchida ............... H01L 29/7869

* cited by examiner

DISPLAY DEVICE AND MANUFACTURING METHOD THEREOF

CLAIM OF PRIORITY

The present application claims priority from Japanese Patent Application JP 2017-086081 filed on Apr. 25, 2017, the content of which is hereby incorporated by reference into this application.

BACKGROUND OF THE INVENTION (1) Field of the Invention

The present invention relates to a display device comprising TFTs (Thin Film Transistor) that use oxide semiconductors.

(2) Description of the Related Art

A liquid crystal display device has a TFT substrate, a counter substrate opposing to the substrate and a liquid crystal layer, sandwiched between the TFT substrate and the counter substrate. The TFT substrate has plural pixels; each of the pixels has a pixel electrode and a thin film transistor (TFT). A transmittance of light in each pixel is controlled by liquid crystal molecules; thus, images are formed. On the other hand, the organic EL display device has a self-illuminant organic EL layer, a driving TFT, and a switching TFT in each pixel; thus, color images are formed.

The oxide semiconductor has a high OFF resistance, thus, if it is used in the TFT, OFF current can be decreased.

The patent document 1 (Japanese patent laid open 2008-294136) discloses the structure that a high resistance metal oxide is formed on the substrate; a part of high resistance metal oxide is decreased in resistance to form the semiconductor, and then, the semiconductor is used as the TFT. The portion of the metal oxide whose resistance is not decreased is used as a separating region between the elements.

SUMMARY OF THE INVENTION

It is preferable to form the high resistance metal oxide only at the portion forming the TFT, not the entire substrate, to increase a transmittance of the pixel. In this case the oxide semiconductor is formed in island shape. The TFT that uses the oxide semiconductor has a merit that the leak current is low. The examples of the oxide semiconductor are IGZO (Indium Gallium Zinc Oxide), ITZO (Indium Tin Zinc Oxide), ZnON (Zinc Oxide Nitride), IGO (Indium Gallium Oxide), and so on. The oxide semiconductors that are optically transparent and amorphous are called TAOS (Transparent Amorphous Oxide Semiconductor). In this specification, if not otherwise defined, the semiconductor means the oxide semiconductor.

The oxide semiconductor changes its conductivity according to the amount of oxygen. The oxygen density distribution is affected greatly by the gate electrode, drain electrode and the source electrode, which are formed above the oxide semiconductor. Therefore, alignment accuracies for the gate electrode, the drain electrode and the source electrode, etc. in lithography become a problem.

The mask alignment, however, has a limitation in accuracy, thus, there exists a variation in the TFT characteristics. The purpose of the present invention is to suppress the variations in characteristics of the TFT; even there exists a variation in accuracy in mask alignment.

The purpose of the present invention is to overcome the above explained problem; the concrete structure is as follows:

(1) A display device including plural pixels, each of the plural pixels having a thin film transistor (TFT) of an oxide semiconductor comprising: a width of the oxide semiconductor in the channel width direction is wider than a width of the gate electrode in the channel width direction.

(2) The display device according to (1), wherein the gate electrode is a scan line, an extending direction of the scan line is channel length direction of the TFT.

(3) The display device according to (1), wherein the oxide semiconductor has an area that doesn't overlap the gate electrode at both sides of the gate electrode in channel width direction.

(4) The display device according to (1), wherein a resistivity of the oxide semiconductor in the area that doesn't overlap the gate electrode is bigger than a resistivity of the oxide semiconductor in the area that overlaps the gate electrode.

(5) A manufacturing method of the display device having a thin film transistor (TFT) including an oxide semiconductor, a gate insulating film on the oxide semiconductor, and a gate electrode on the gate insulating film comprising: forming a width of an oxide semiconductor in a channel width direction wider than a width of the gate electrode in a channel width direction, and oxidizing a portion of the oxide semiconductor that is not covered by the gate electrode.

(6) A manufacturing method of the display device having a thin film transistor (TFT) including an oxide semiconductor, a gate insulating film on the oxide semiconductor, and a gate electrode on the gate insulating film comprising: forming a width of an oxide semiconductor in a channel width direction wider than a width of the gate electrode in a channel width direction, eliminating a portion of the gate insulating film that is not covered by the gate electrode, and oxidizing a portion of the oxide semiconductor that is not covered by the gate electrode.

DETAILED DESCRIPTION OF THE PREFERRED EMBODIMENTS

Figure 1:
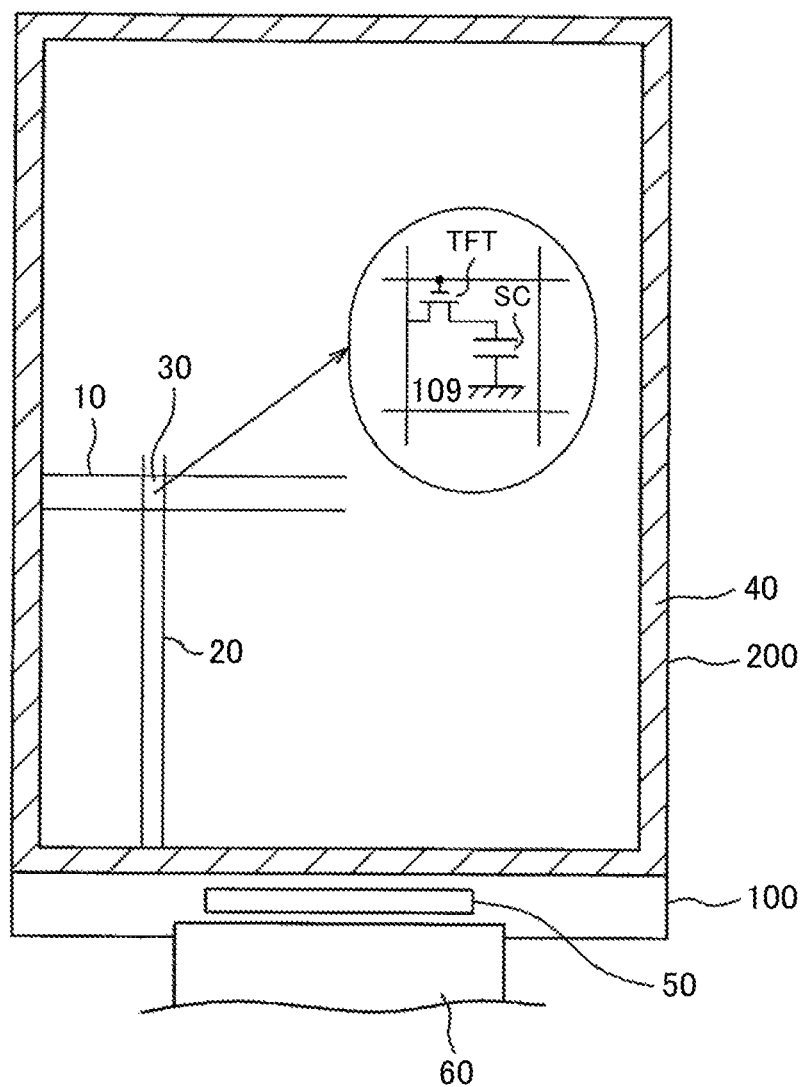
FIG. 1 is a plan view of a liquid crystal display device.

The present invention will be described in detail referring to the following embodiments.
First Embodiment
The invention is explained in regard to the liquid crystal display device, at first. FIG. 1 is a plan view of a liquid crystal display device, which is used in e.g. the cellar phone. In FIG. 1, the TFT substrate 100, in which the scan lines 10 and video signal lines 20 and so on are formed, and the counter substrate 200, in which a black matrix and so on are formed, adhere to each other via the seal material 40. The liquid crystal is sandwiched by the TFT substrate 100 and the counter substrate 200.

The TFT substrate 100 is bigger than the counter substrate 200; the portion of the TFT substrate 100 that doesn't overlap with the counter substrate 200 is a terminal area. The driver IC 50, which drives the liquid crystal device is installed in the terminal area. The flexible wiring substrate 60, which supplies powers and signals to the liquid crystal display device, is connected to the terminal area.

In FIG. 1, the scan lines 10 extend in a lateral direction and are arranged in a longitudinal direction; the video signal lines 20 extend in the longitudinal direction and arranged in the lateral direction. The pixel 30 is formed in the area surrounded by the scan lines 10 and the video signal lines 20. In each of the pixels 30, the TFT and the storage capacitance SC are formed. The TFT controls the signals that are to be supplied from the video signal lines 20 to the pixel electrode; the storage capacitance holds the video signal data for one frame period. One terminal of the storage capacitance SC is connected to the TFT and another terminal is connected to the common wiring VC.

Figure 2:
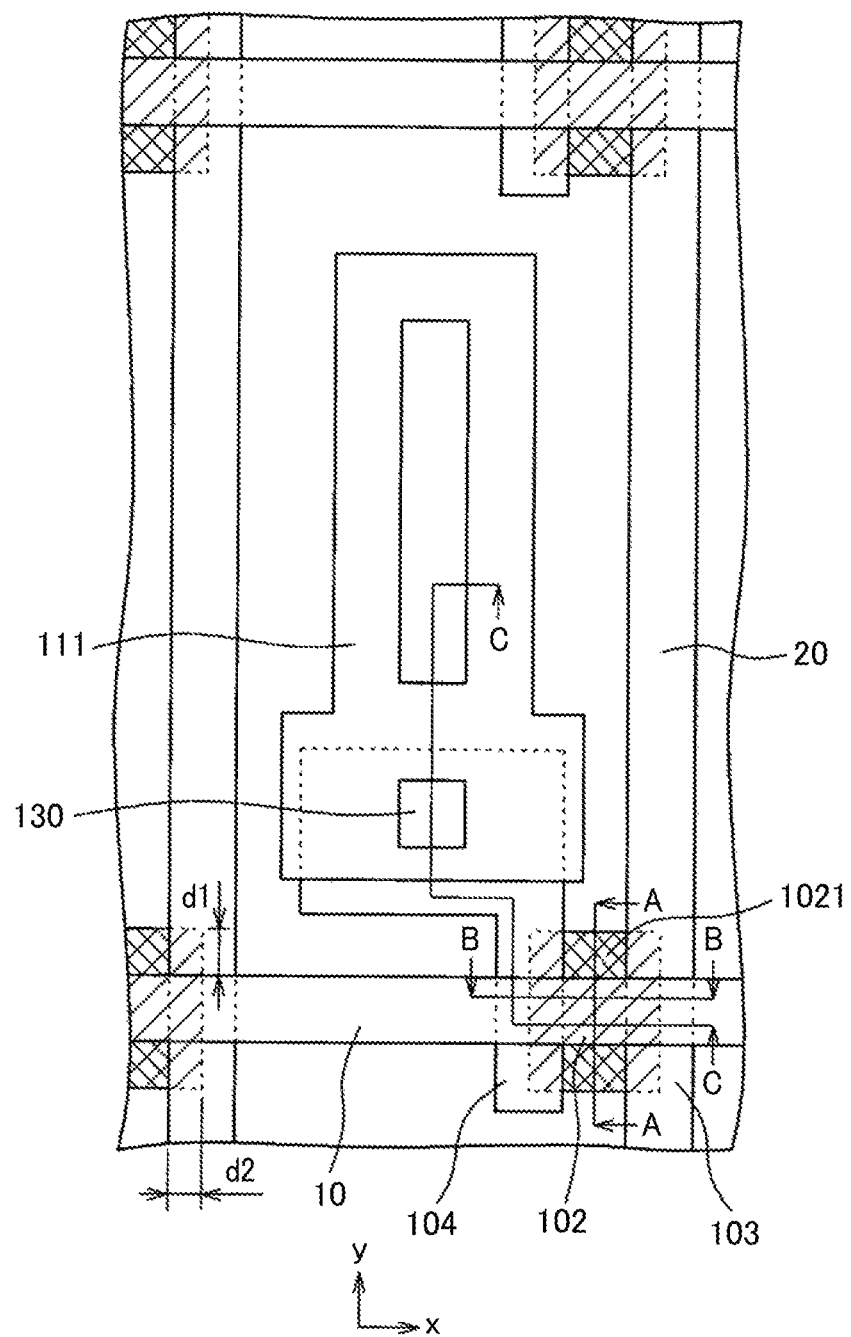
FIG. 2 is a plan view of the pixel of the liquid crystal display device.

FIG. 2 is a plan view of the pixel of the liquid crystal display device according to the present invention. The scan lines 10 extend in a lateral direction and are arranged in a longitudinal direction; the video signal lines 20 extend in the longitudinal direction and arranged in the lateral direction. The pixel electrode 111 is formed in the area surrounded by the scan lines 10 and the video signal lines 20. In FIG. 2, the pixel electrode 111 has two comb-like electrodes sandwiching a slit. When the area of the pixel becomes smaller, the pixel electrode 111 can have only one stripe shaped electrode.

In FIG. 2, the TFT of the oxide semiconductor 102 exists in the lower right corner of the pixel. In FIG. 2, a rectangular shaped semiconductor layer 102 is formed; the source electrode 104 is formed overlapping the semiconductor layer 102 on the left; the drain electrode 103 is formed overlapping the semiconductor layer 102 on the right. In FIG. 2, video signal line 20 works as the drain electrode 103. The scan line 10 is formed over the semiconductor layer 102. The scan line 10 works as the gate electrode of the TFT.

In the semiconductor layer 102, the portion below the gate electrode is the channel. The width of the channel is determined by the width of the gate electrode, namely, by the width of the scan line 10. As depicted in FIG. 2, the width of the semiconductor layer 102 is wider than the width of the scan line 10; thus characteristics of the TFT is not influenced even if there occurs variation in mask alignment between the scan line 10 and the semiconductor layer 102.

In FIG. 2, the semiconductor layer 102 is wider than the scan line 10 in an amount of d1 in one side; d1 is approximately 1 micron. The amount that the semiconductor layer 102 overlaps with the source electrode 104 or with the drain electrode 103 is d2; d2 is approximately 3 micron. Both d1 and d2 are bigger enough than the mask alignment accuracy.

In FIG. 2, however, the semiconductor layer 102 has the uncovered area 1021, which is not covered by the scan line, the drain electrode 103, and the source electrode 104. If the resistance of the uncovered area 1021 becomes smaller by being reduced, the TFT will short; consequently, the TFT doesn't work. The invention characterizes in that making the resistivity of the uncovered area as big as 1 Teraohm·cm ($10^{12}$ Ω·cm) by supplying enough oxygen; thus, stabilizes the characteristics of the TFT.

In FIG. 2, the source electrode 103 extends to the pixel electrode 111 from the semiconductor layer 102 to connect with the pixel electrode 111 via through hole 130. When the TFT turns ON, the video signals are supplied to the pixel electrode 111. The common electrode is formed under the pixel electrode 111; the storage capacitance SC, formed between the pixel electrode and the common electrode, holds the video signal for one frame period.

Figure 3:
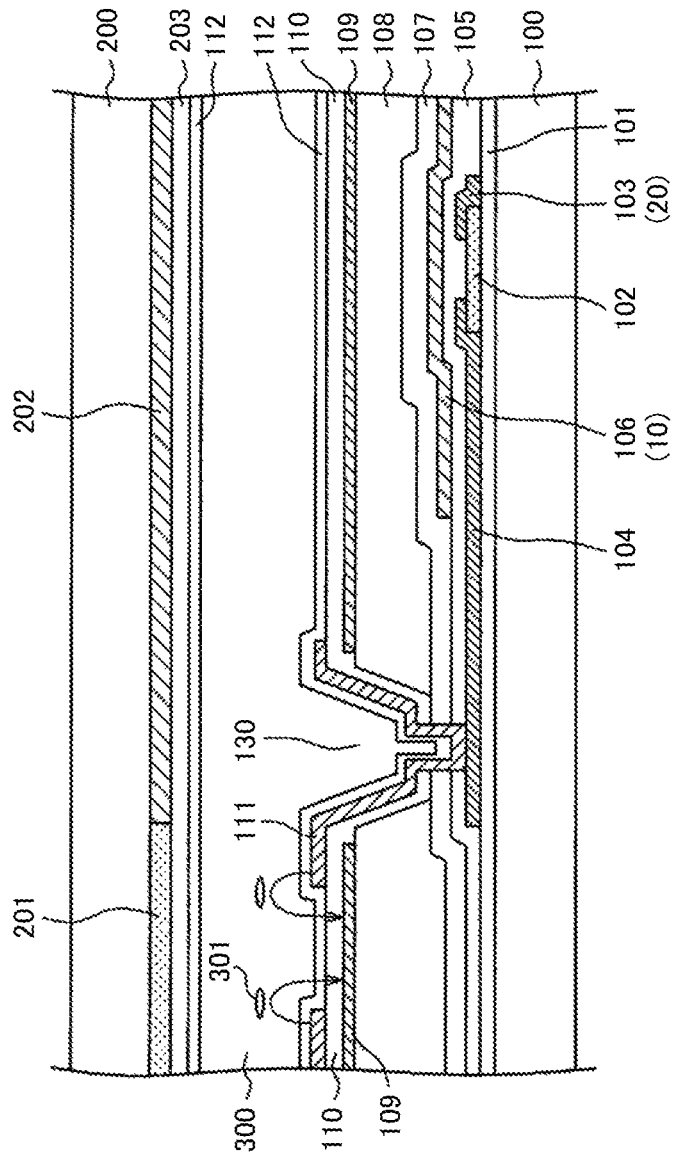
FIG. 3 is a cross sectional view along the C-C line of FIG. 2.

FIG. 3 is a cross sectional view along the C-C line of FIG. 2. In FIG. 3, the undercoat 101 is formed on the TFT substrate 100. The TFT substrate 100 is generally made of glass; however, if the display is a sheet display, the TFT substrate is made of resin e.g. polyimide. The undercoat 101 prevents that the impurities, come from glass, etc., contaminate the semiconductor layer 102. The undercoat 101 is generally formed by a laminated film of the silicon oxide (SiO herein after) layer and the silicon nitride (SiN herein after) layer. In this case, the SiO layer contacts with the oxide semiconductor 102 because SiN deprives the oxide semiconductor of oxygen, consequently, the characteristics of the oxide semiconductor 102 tends to be changed.

The oxide semiconductor 102 is formed on the undercoat 101 and is patterned. IGZO is e.g. used for the oxide semiconductor 102. The video signal line 20 as the drain electrode 103 is formed overlapping the semiconductor 102 at the right; the source electrode 104 is formed overlapping the semiconductor 102 at the left. The channel is formed between the drain electrode 103 and the source electrode 104.

The gate insulating film 105 is formed over the oxide semiconductor 102, the drain electrode 103 and the source electrode 104. The gate insulating film 105 is formed by CVD (Chemical Vapor Deposition) using TEOS (Tetraethyl orthosilicate) as the material. The gate electrode 106, which also works as a scan line 10, is formed on the gate insulating film 105. The upper layer oxide film 107 is formed over the scan line 10. The upper layer oxide film 107, which is an oxygen rich silicon oxide film, stabilizes the characteristics of the TFT of the oxide semiconductor 102. The organic passivation film 108, which also works as a flattening film, is formed on the upper layer oxide film 107.

In FIG. 3, the source electrode 104 extends to the pixel electrode side to connect with the pixel electrode 111 in the through hole 130. The common electrode 109 is formed on the organic passivation film 108; the capacitive insulating film 110, which is formed by SiN, is formed on the common electrode 109. The comb-like shaped pixel electrode 111 is formed on the capacitive insulating film 110. The line of force depicted by the arrow in FIG. 3 is generated when the video signal is supplied to the pixel electrode 111 to rotate the liquid crystal molecules 301; thus, the amount of light from the backlight is controlled. The storage capacitance SC is formed between the pixel electrode 111 and the common electrode 109 sandwiching the capacitive insulating film 110.

The alignment film 112, made of polyimide, is formed over the pixel electrode 111 and the capacitive insulating film 110 for initial alignment of the liquid crystal molecules 301. Alignment for the alignment film 112 is conducted through rubbing method or optical alignment method, which uses ultra violet ray.

In FIG. 3, the liquid crystal layer 300 is sandwiched between the TFT substrate 100 and the counter substrate 200. The color filter 201 and the black matrix 202 are formed inside of the counter substrate 200. The overcoat film 203 is formed over the color filter 201 and the black matrix 202; the alignment film 112 is formed over the overcoat film 203.

Back to FIG. 2, the feature of the present invention is to make the width of the oxide semiconductor 102 in channel width direction bigger than the width of the scan line 10, which works as the gate electrode, to suppress the variation in TFT characteristics due to variation of the mask alignment. As a result, the uncovered area 1021 of the oxide semiconductor 102, which is not covered by the gate electrode (the scan line 10), the drain electrode 103 or the source electrode 104, is generated. In the present invention, however, the uncovered area 1021 is oxidized and rendered high resistivity as high as 1 Teraohm·cm or more, thus, an influence of the variation in mask alignment to the characteristics of the TFT is avoided.

Figure 4:
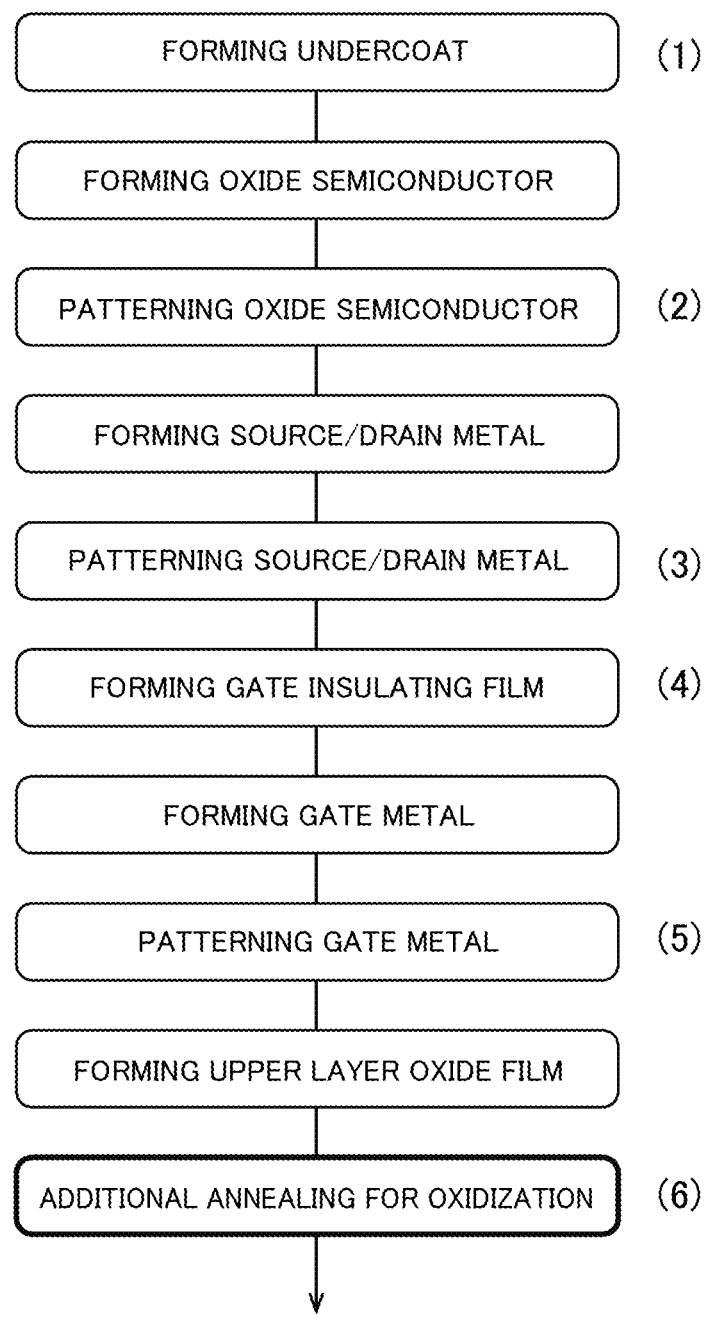
FIG. 4 is a flow chart of the manufacturing process of the first embodiment.
Figure 5:
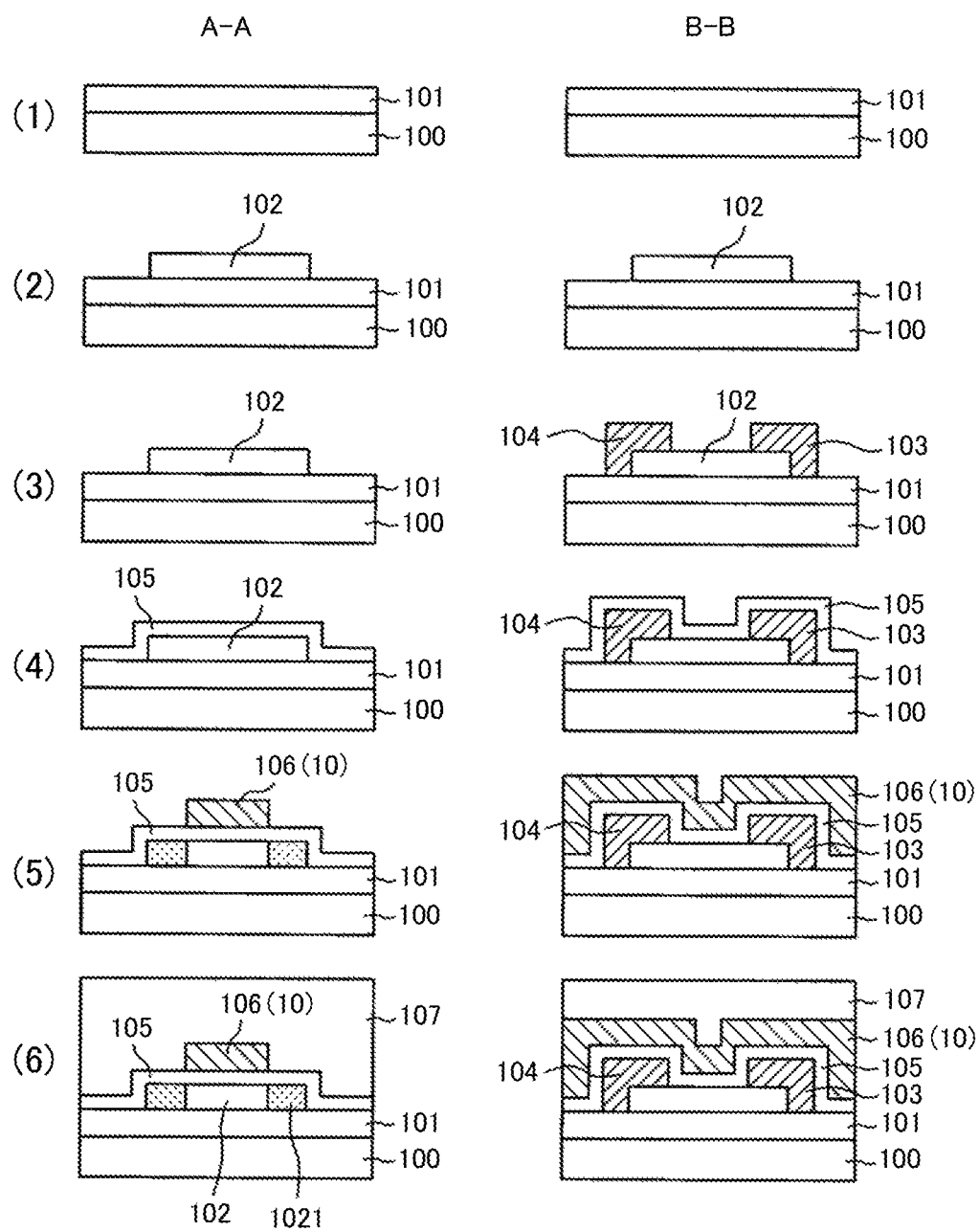
FIG. 5 is cross sectional views along the A-A line of FIG. 2 and cross sectional views along the B-B line of FIG. 2 corresponding to FIG. 4.

FIG. 4 is a process flow chart that includes the measure to make the uncovered area 1021 high resistance. FIG. 5 is a cross sectional views corresponding to FIG. 4. In FIG. 5, A-A corresponds to the cross sectional views along the A-A line in FIG. 2; B-B corresponds to the cross sectional views along the B-B line in FIG. 2. In other words, A-A is a cross sectional view of the TFT in a channel width direction while B-B is a cross sectional view in a channel length direction I each of the process. (1) to (6) in FIG. 4 correspond to (1) to (6) in FIG. 5.

In FIGS. 4 and 5, the undercoat 101 is formed on the TFT substrate 100 (1). The oxide semiconductor 102 is formed by CVD on the undercoat 101 and then patterned (2). After that, source/drain metal is formed, then patterned to form the drain electrode 103 and the source electrode 104 (3).

After that, the gate insulating film 105 is formed by CVD (4). The metal for the gate electrode 106 is formed on the gate insulating film 105, then the metal is patterned to make the gate electrode 106 (5). The upper layer oxide film 107 is formed by CVD over the gate electrode 106. The upper layer oxide film 107 is a SiO film; however, it is an oxygen rich film. After that, an additional annealing is conducted.

Annealing temperature is 300 C.° or more; the annealing temperature can be high because the organic passivation film 108, etc. are not formed at this point. In the annealing process, oxygen in the upper layer oxide film 107 moves into the uncovered area 1021 of the oxide semiconductor 102 through the gate insulating film 105; thus, the uncovered area 1021 is oxidized (6). The dotted area 1021 in FIG. 5, A-A (6) depicts that the uncovered area 1021 is oxidized during the annealing process. Thanks to the oxidization, the resistivity of the uncovered area 1021 becomes as high as 1 Teraohm·cm or more; thus, influence of the variation in mask alignment to the characteristics of the TFT can be avoided.

In the meantime, the structure of FIG. 5, B-B (6) is not influenced by the annealing process. However, a merit can be expected as that the oxygen from the upper layer oxide film 107 may compensate oxygen in the oxide semiconductor even if oxygen has been excessively extracted from the oxide semiconductor 102 when the drain electrode 103 and the source electrode 104 were formed.

Figure 6:
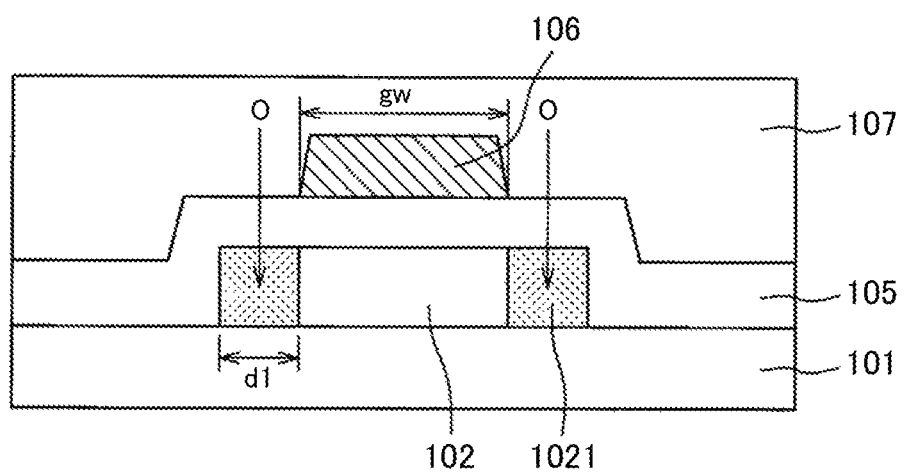
FIG. 6 is a cross sectional view of the first embodiment.

FIG. 6 is a cross sectional view that shows a model of the function of FIG. 5, A-A (6). FIG. 6 shows oxygen diffuses from the upper layer oxide film 107, which is oxygen rich silicon oxide film, to the uncovered area 1021 through the gate insulating film 105; thus, the uncovered area 1021 is made high resistance. By the way, the thickness of the gate insulating film 105 is approximately 200 nm, thus, oxygen can diffuse from the upper layer oxide film 107 through the gate insulating film 105. FIG. 6 is a cross sectional view in the channel width direction. The width of the gate electrode, which is the same as the width gw of the scan electrode, is approximately 6 micron, which is the width of the channel. Therefore, there is a region that oxygen density is high in a channel width direction in FIG. 6. The width of the oxide semiconductor is wider than the width of the scan line in a dimension d1 in one side. Amount of d1 is approximately 1 micron.

As described above, according to the present invention, the influence of variation in mask alignments of the oxide semiconductor 102, the gate electrode 106 (the scan line 10), the drain electrode 103 and the source electrode 104 can be avoided. Further, the uncovered area 1021 of the oxide semiconductor 102 can be a high resistant area, thus, the influence of the uncovered area 1021 to the characteristics of the TFT can be avoided.

Second Embodiment

Figure 7:
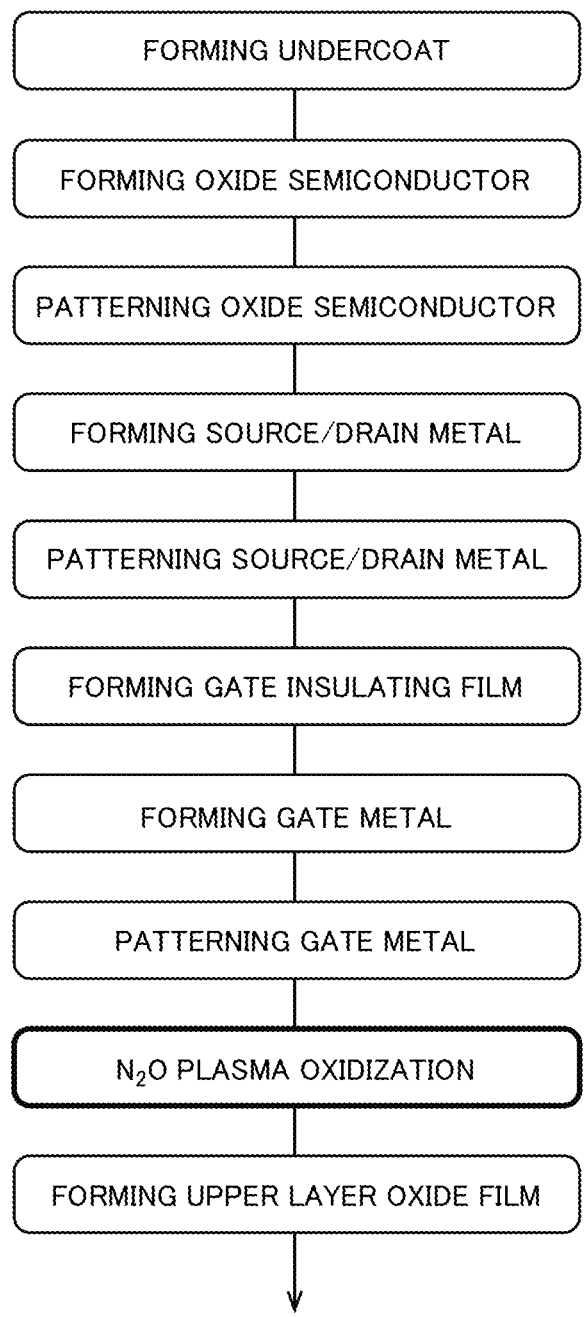
FIG. 7 is a flow chart of the manufacturing process of the first embodiment.

FIG. 7 is a process flow chart that oxidizes the uncovered area 1021 in FIG. 2 and makes it a high resistance area in the second embodiment. FIG. 7 differs from FIG. 4 in that whole the substrate is exposed to the $N_2O$ plasma to oxidize after the gate electrode 106 is patterned. This process is shown by thick frame in FIG. 7. Oxygen supplied from the $N_2O$ plasma penetrates the gate insulating film 105 and reaches to the uncovered area 1021 of the oxide semiconductor 102. Consequently, the resistivity of the uncovered area becomes 1 Teraohm·cm or more.

Figure 8:
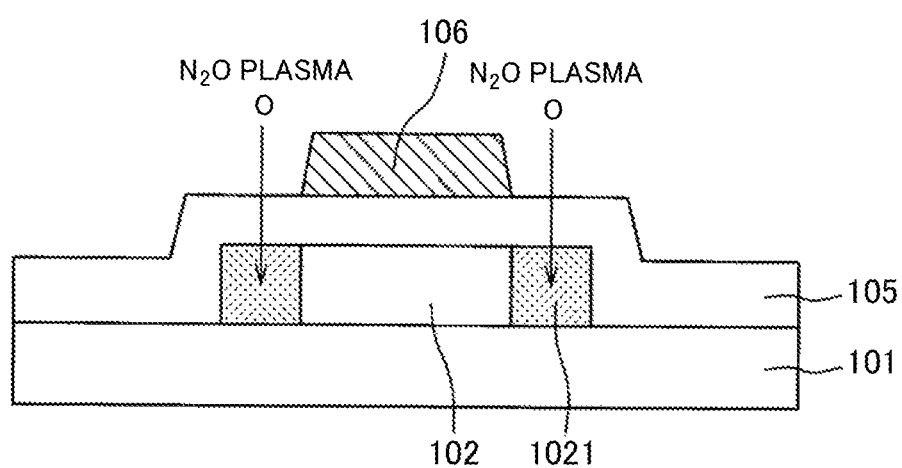
FIG. 8 is a cross sectional view of the second embodiment.

FIG. 8 is a cross sectional view along the A-A line in FIG. 2. In FIG. 8, oxygen form $N_2O$ plasma penetrates the gate insulating film 105 and reaches to the uncovered area 1021; thus, the uncovered area 1021 is oxidized. In the meantime, the area covered by the gate electrode 106 is not oxidized, thus, the characteristics of the channel are not changed. After that, as shown in FIG. 7, the upper layer oxide film 107 is formed by CVD.

Third Embodiment

Figure 9:
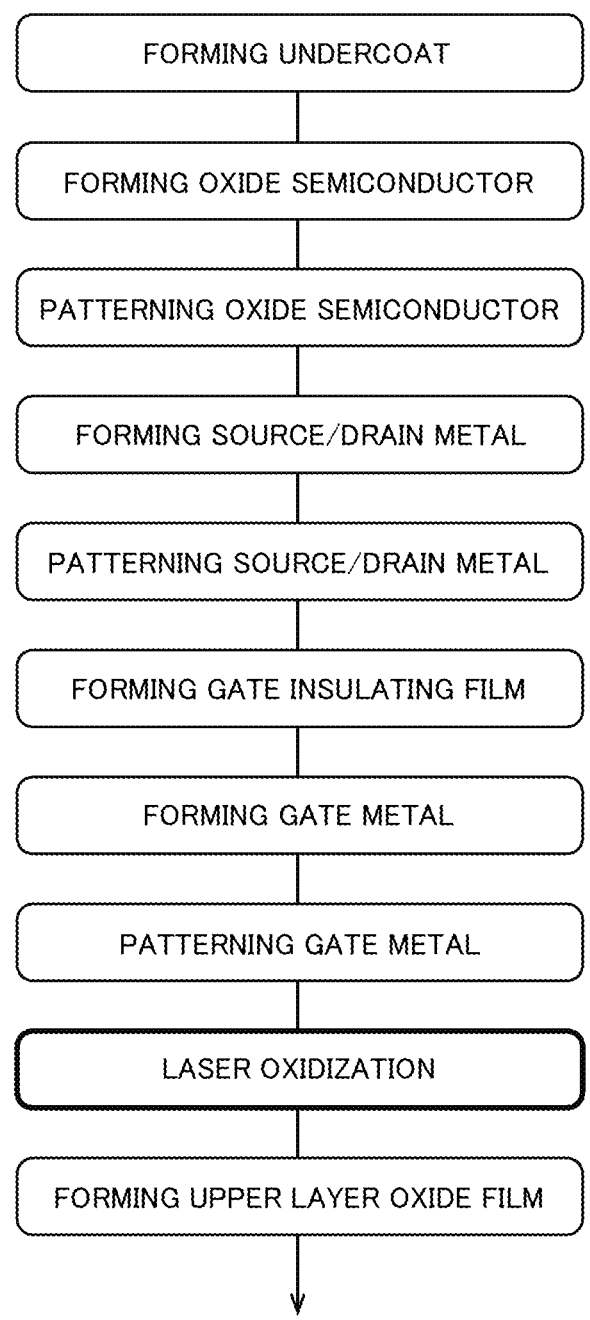
FIG. 9 is a flow chart of the manufacturing process of the third embodiment.

FIG. 9 is a process flow chart that oxidizes the uncovered area 1021 in FIG. 2 and makes it a high resistance area in the third embodiment. FIG. 9 differs from FIG. 4 in that the laser is applied to the oxide semiconductor 102 in an oxygen environment after the gate electrode 106 is patterned to oxidize the uncovered area 1021 of the oxide semiconductor 102. This process is shown by a thick frame in FIG. 9.

Figure 10:
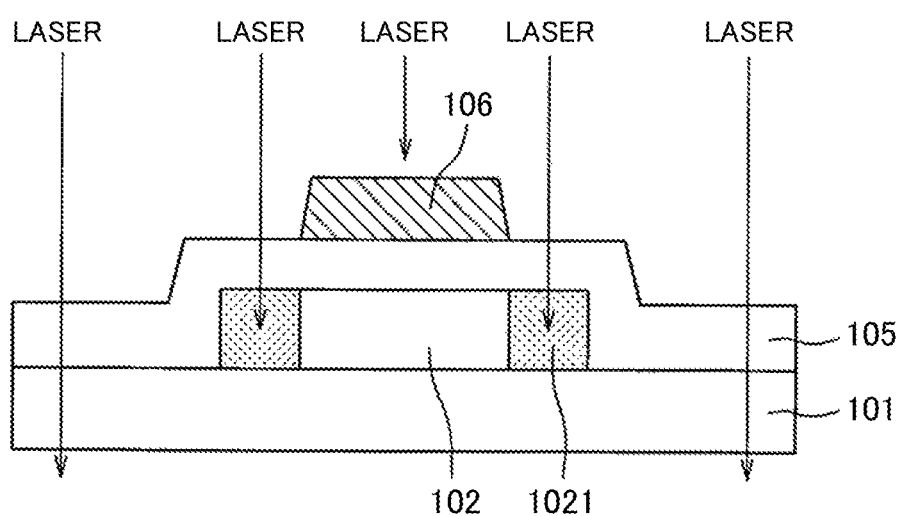
FIG. 10 is a cross sectional view of the third embodiment.

FIG. 10 is a cross sectional view along the A-A line in FIG. 2. When IGZO is chosen as the oxide semiconductor 102, the wave length of the laser is chosen approximately 180 nm to 400 nm so that the laser can efficiently absorbed by IGZO. The laser can be intermittently irradiated with frequency of 250 Hz to 350 Hz. The oxide semiconductor 102 is heated by the laser, consequently, the uncovered area 1021 of the oxide semiconductor 102 easily absorbs oxygen in the oxygen environment; thus, this area is oxidized, consequently, the resistivity of the uncovered area 1021 can be as high as 1 Teraohm·cm or more.

As to the layers other than the oxide semiconductor 102, the absorption rate of the laser is low, thus, the laser goes through the other layers. In the meantime, the laser is reflected by the gate electrode 106. Therefore the oxide semiconductor 102 below the gate electrode 106 is not heated, thus, channel characteristics don't change. After that, as shown in FIG. 9, the upper layer oxide film 107 is formed by CVD.

Fourth Embodiment

Figure 11:
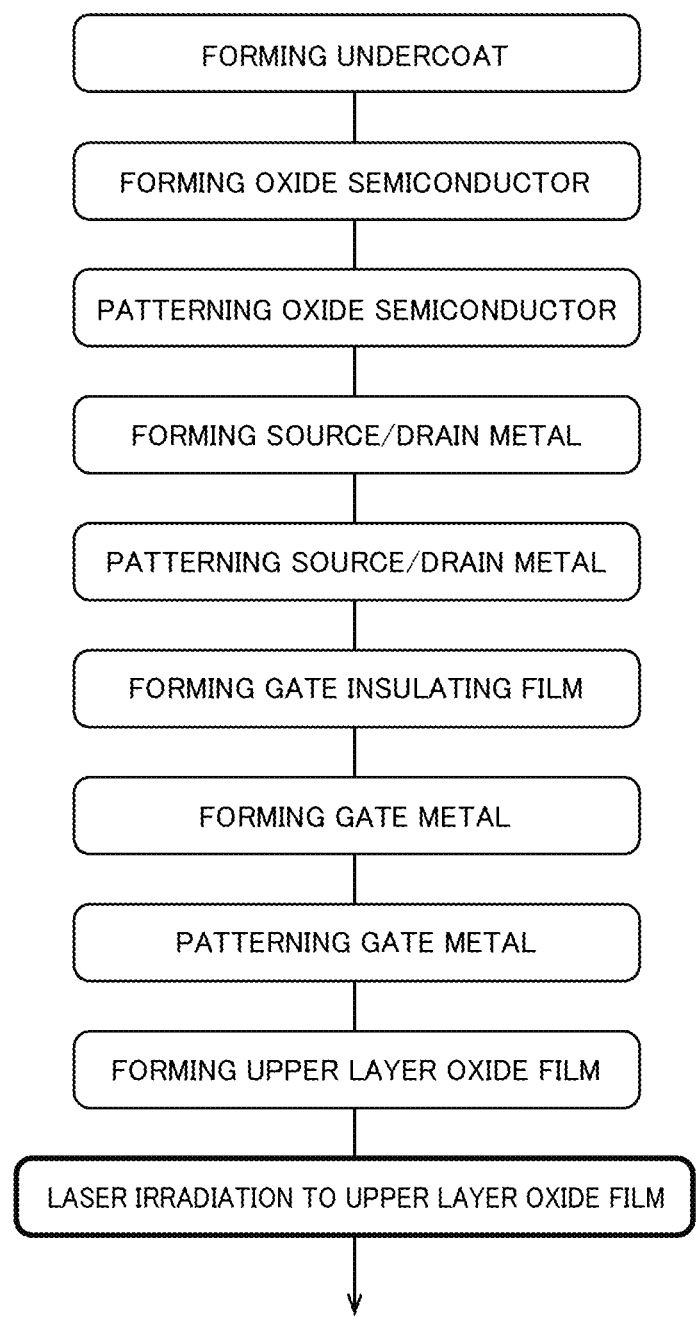
FIG. 11 is a flow chart of the manufacturing process of the fourth embodiment.

FIG. 11 is a process flow chart that oxidizes the uncovered area 1021 in FIG. 2 and makes it a high resistance area in the fourth embodiment. FIG. 11 differs from FIG. 4 in that, after the upper layer oxide film 107 is formed, the laser is applied to heat the upper layer oxide film 107 instead of annealing. This process is shown by a thick frame in FIG. 11.

Figure 12:
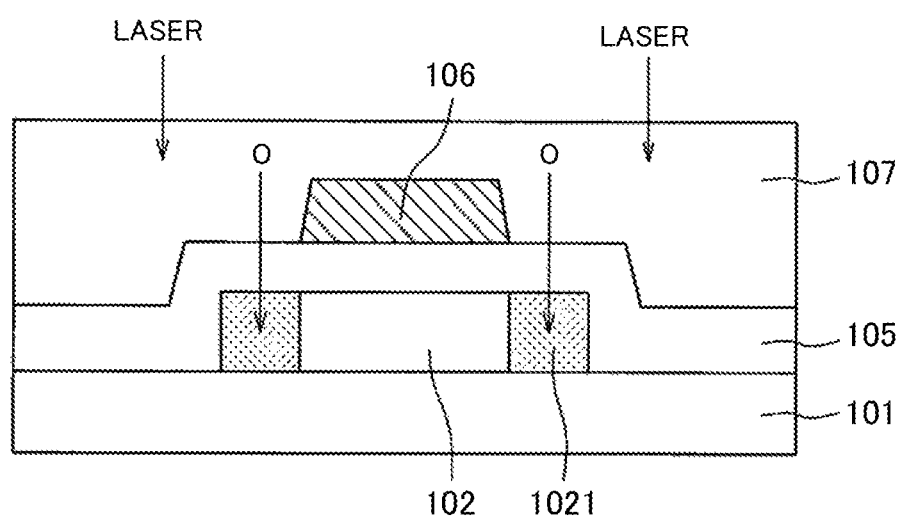
FIG. 12 is a cross sectional view of the fourth embodiment.

FIG. 12 is a cross sectional view along the A-A line in FIG. 2 according to the fourth embodiment. The laser in this embodiment has wave lengths that are easily absorbed by the upper layer oxide film 107. Since the upper layer oxide film 107 is an oxygen rich SiO film, it discharges oxygen when the film 107 is heated and activated; this oxygen penetrate the gate insulating film 105 and reaches the uncovered area 1021 of the oxide semiconductor 102; consequently, the uncovered area 1021 is oxidized and the resistivity of the uncovered area 1021 becomes to 1 Teraohm·cm or more. In the meantime, the oxygen from the upper layer oxide film 107 is blocked by the gate electrode 106, thus, characteristics of the channel are not changed.

Fifth Embodiment

Figure 13:
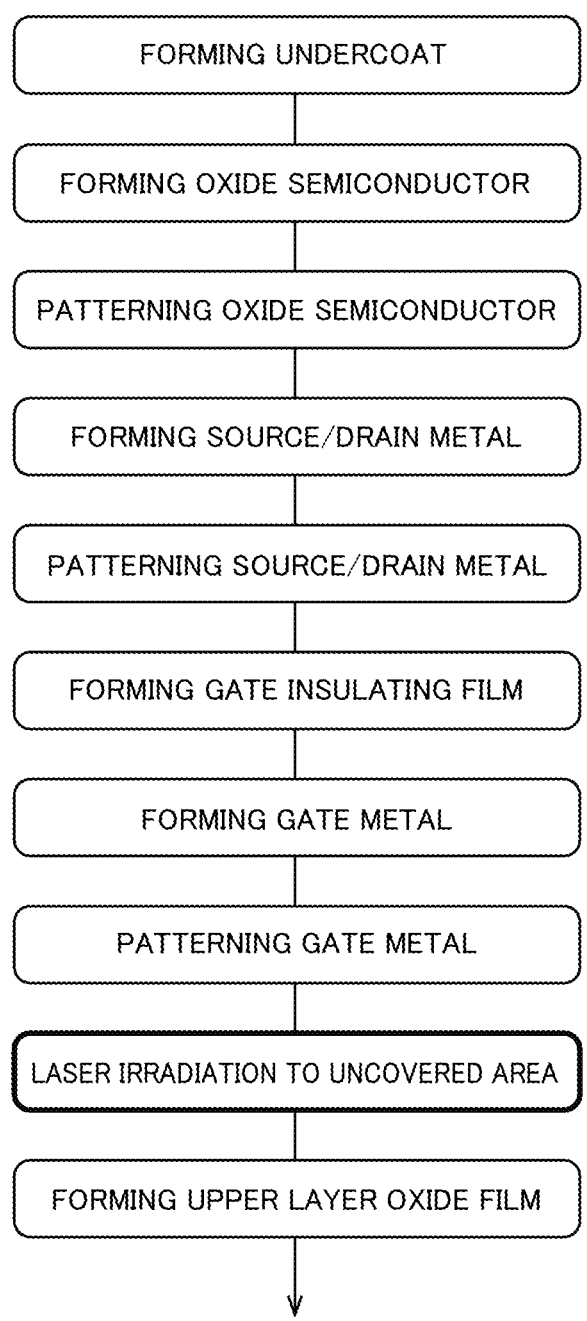
FIG. 13 is a flow chart of the manufacturing process of the fifth embodiment.

FIG. 13 is a process flow chart that oxidizes the uncovered area 1021 in FIG. 2 and makes it a high resistance area in the fifth embodiment. FIG. 13 differs from FIG. 4 in that, after the gate electrode 106 is patterned, pulse laser of short wave length is applied to the uncovered area 1021 of the oxide semiconductor 102 to oxidize the uncovered area 1021. The feature of this embodiment is to apply the laser locally in the uncovered area 1021 not to the entire substrate. This process is shown by a thick frame in FIG. 13.

Figure 14:
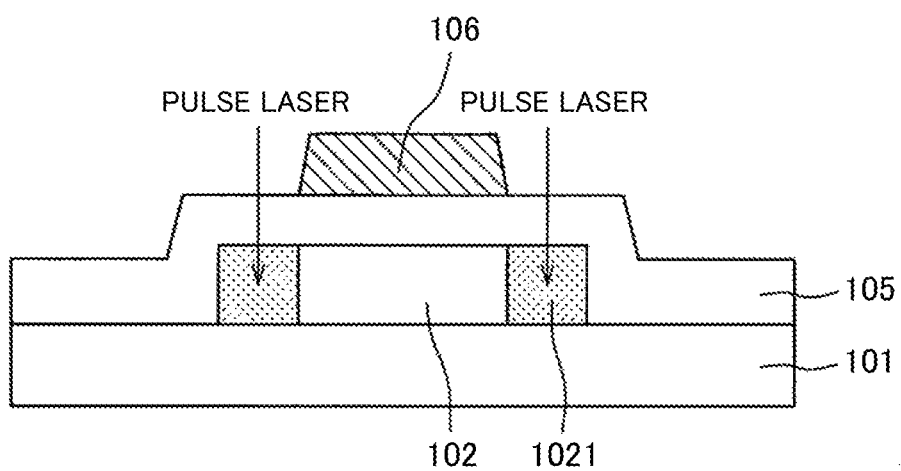
FIG. 14 is a cross sectional view of the fifth embodiment.

FIG. 14 is a cross sectional view along the A-A line in FIG. 2. The wave lengths of the pulse laser are chosen to be absorbed easily by the oxide semiconductor 102. The pulse laser is focused to be applied locally to the uncovered area 1021 in FIG. 14. The uncovered area of the oxide semiconductor 102 is heated by laser, consequently, the heated area easily absorbs oxygen; thus, this area is oxidized, consequently, the resistivity of the uncovered area 1021 can be as high as 1 Teraohm·cm or more. In the meantime, the laser is not irradiated to the oxide semiconductor 102 under the gate electrode 106, thus, this area is not heated; therefore, channel characteristics don't change. After that, as shown in FIG. 13, the upper layer oxide film 107 is formed by CVD.

Laser irradiations in the third to fifth embodiments, the pulse laser is preferable to avoid heating up of the other elements.

Sixth Embodiment

Figure 15:
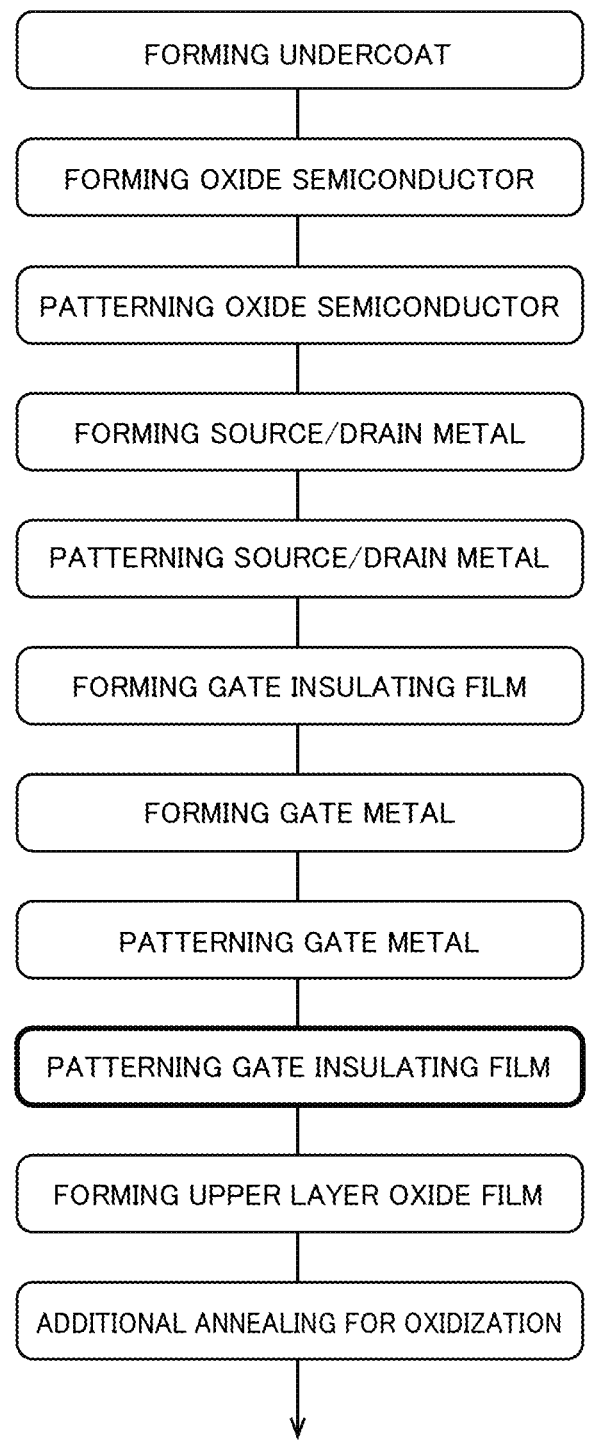
FIG. 15 is a flow chart of the manufacturing process of the sixth embodiment.

FIG. 15 is a process flow chart that oxidizes the uncovered area 1021 in FIG. 2 and makes it a high resistance area in the sixth embodiment. FIG. 15 differs from FIG. 4 in that the gate insulating film 105 is eliminated by dry etching with the fluorine based gas using the gate electrode 106 as the mask after the gate electrode 106 is patterned by dry etching with the chlorine based gas. This process is shown by a thick frame in FIG. 15. After that the upper layer oxide film 107 is formed, then, additional annealing is applied.

Figure 16:
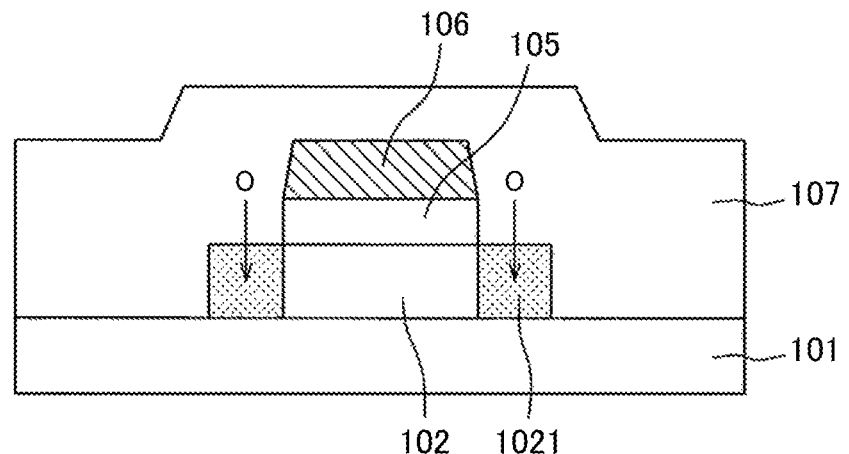
FIG. 16 is a cross sectional view of the sixth embodiment.

FIG. 16 is a cross sectional view along the A-A line in FIG. 2. In FIG. 16, the gate insulating film 105 exists only under the gate electrode 106. The uncovered area 1021 of the oxide semiconductor 102 is directly covered by the upper layer oxide film 107, which is made of oxygen rich silicon oxide (SiO) film. When annealing is made in this state, oxygen is directly supplied to the uncovered area 102 from the upper layer oxide film 107, thus, the uncovered area 1021 is efficiently oxidized, therefore, the resistivity of the uncovered area 1021 can easily reaches to 1 Teraohm·cm or more.

In the meantime, as to the measure of oxidizing the uncovered area 1021, $N_2O$ plasma or laser irradiation, which were explained in the second to fifth embodiments can be adopted instead of the additional annealing.

Seventh Embodiment

In the first to sixth embodiments, the present invention is explained in regard to the liquid crystal display device; however, the present invention is applicable to the organic EL display device, too. The organic EL display device uses the switching TFT and the driving TFT in the display area; the present invention is adopted when those TFTs are made by the oxide semiconductor.

Figure 17:
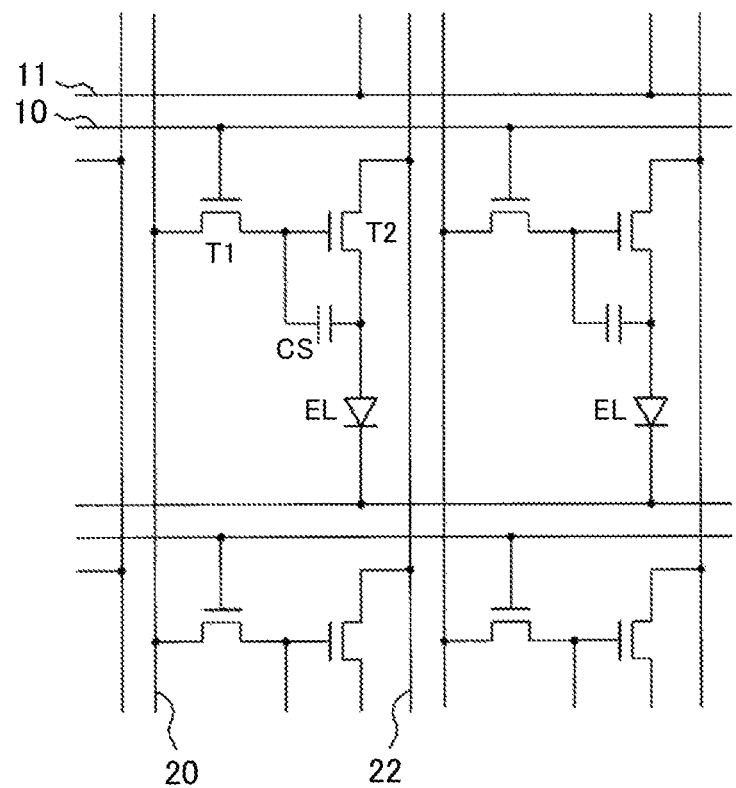
FIG. 17 is an equivalent circuit of the pixel in organic EL display device.

FIG. 17 is an example of an equivalent circuit of the pixel of the organic EL display device. In FIG. 17, the pixel is formed in an area surrounded by the scan line 10, the earth line 11, the video signal line 20 and the source line 21. In the pixel, the organic EL element (EL) formed by the organic EL layer and the driving TFT (T2) are connected in series. The storage capacitance SC is formed between the gate and the drain of the driving TFT (T2). Current is supplied to the organic EL element (EL) from the driving TFT according to a voltage of the storage capacitance SC.

In FIG. 17, the gate of the selecting TFT (T1) connects to the scan line 10, T1 becomes ON or OFF according to ON or OFF signal in the scan line 10. When the selecting TFT (T1) is ON, video signal is supplied from the video signal line 20 to the storage capacitance SC, then, the storage capacitance SC is charged up. The driving TFT (T2) is driven according to the voltage of the storage capacitance SC, then, current flows in the organic EL element (EL).

In the structure of FIG. 17, the first TFT (T1) and the second TFT (T2) are formed in the pixel; the first TFT (T1) is a switching TFT, the second TFT (T2) is a driving TFT for driving the organic EL layer (EL). By the way, the first TFT (T1) can be a double gate structure. If the first TFT (T1) and the second TFT (T2) are formed by the oxide semiconductor, a leak current can be decreased, thus, the organic EL display device of low power consumption can be realized. Both of the first TFT (T1) and the second TFT (T2) can adopt the structure which were explained in the first to sixth embodiments, consequently, the influence of variation in mask alignment can be suppressed and the TFT having stable characteristics can be attained. Therefore, the display device having high quality images can be realized.

In the above embodiments, it was explained that the TFTs are used in the pixels in the both cases where the display device is the liquid crystal display device and is the organic EL display device. Certain displays have driving circuits formed by TFTs at the peripheral area. Those TFTs can be formed by the oxide semiconductors; in that case the present invention is applicable to the TFTs in the peripheral circuit.

What is claimed is:

1. A display device including plural pixels, each of the plural pixels having a thin film transistor (TFT) comprising an oxide semiconductor, a drain electrode, a source electrode, a gate insulating film, a gate electrode, and a channel, which is formed in the oxide semiconductor between the drain electrode and the source electrode, a channel length direction is defined by a direction the drain electrode and the source electrode oppose to each other, a channel width direction is defined by a direction orthogonal to the channel length direction, wherein a width of the oxide semiconductor in the channel width direction is wider than a width of the gate electrode in the channel width direction, wherein the gate electrode is a scan line, an extending direction of the scan line is in the channel length direction of the TFT, and wherein the gate insulating film is formed between the gate electrode and the oxide semiconductor, and the oxide semiconductor that is not covered by the gate electrode is covered by a silicon oxide film in addition to the gate insulating film.

2. The display device according to claim 1, wherein the oxide semiconductor has an area that does not overlap the gate electrode at both sides of the gate electrode in channel width direction.

3. The display device according to claim 1, wherein either one of a drain electrode and a source electrode of the TFT is a video signal line.

4. The display device according to claim 1, wherein the display device is a liquid crystal display device.

5. The display device according to claim 1, wherein the display device is an organic EL display device.

6. A display device including plural pixels, each of the plural pixels having a thin film transistor (TFT) comprising an oxide semiconductor, a drain electrode, a source electrode, a gate insulating film, a gate electrode, and a channel, which is formed in the oxide semiconductor between the drain electrode and the source electrode, a channel length direction is defined by a direction the drain electrode and the source electrode oppose to each other, a channel width direction is defined by a direction orthogonal to the channel length direction.

wherein a width of the oxide semiconductor in the channel width direction is wider than a width of the gate electrode in the channel width direction, wherein the gate electrode is a scan line, an extending direction of the scan line is in the channel length direction of the TFT, wherein a resistivity of the oxide semiconductor in the area that does not overlap the gate electrode is greater than a resistivity of the oxide semiconductor in the area that overlaps the gate electrode, and wherein the gate insulating film is formed between the gate electrode and the oxide semiconductor, the oxide semiconductor that is not covered by the gate electrode is covered by a silicon oxide film in addition to the gate insulating film.

7. The display device according to claim 6, wherein the oxide semiconductor has an area that does not overlap the gate electrode at both sides of the gate electrode in channel width direction.

8. The display device according to claim 6, wherein either one of a drain electrode and a source electrode of the TFT is a video signal line.

9. The display device according to claim 6, wherein the display device is a liquid crystal display device.

10. The display device according to claim 6, wherein the display device is an organic EL display device.

11. A display device including plural pixels, each of the plural pixels having a thin film transistor (TFT) comprising an oxide semiconductor, a drain electrode, a source electrode, a gate insulating film, a gate electrode, and a channel, which is formed in the oxide semiconductor between the drain electrode and the source electrode, a channel length direction is defined by a direction the drain electrode and the source electrode oppose to each other, a channel width direction is defined by a direction orthogonal to the channel length direction, wherein a width of the oxide semiconductor in the channel width direction is wider than a width of the gate electrode in the channel width direction, wherein the gate electrode is a scan line, an extending direction of the scan line is in the channel length direction of the TFT, wherein a drain electrode and a source electrode of the TFT are formed on a lower layer than a gate electrode of the TFT, wherein a drain electrode and a source electrode directly contact the oxide semiconductor of the TFT without a through hole, and wherein the gate insulating film is formed between the gate electrode and the oxide semiconductor, the oxide semiconductor that is not covered by the gate electrode is covered by a silicon oxide film in addition to the gate insulating film.

12. The display device according to claim 11, wherein the oxide semiconductor has an area that does not overlap the gate electrode at both sides of the gate electrode in channel width direction.

13. The display device according to claim 11, wherein either one of a drain electrode and a source electrode of the TFT is a video signal line.

14. The display device according to claim 11, wherein the display device is a liquid crystal display device.

15. The display device according to claim 11, wherein the display device is an organic EL display device.

* * * * *